United States Patent

Ohno et al.

(10) Patent No.: US 6,590,347 B2
(45) Date of Patent: Jul. 8, 2003

(54) LIGHT-EMITTING ELEMENT MATRIX ARRAY

(75) Inventors: Seiji Ohno, Osaka (JP); Yukihisa Kusuda, Osaka (JP); Shunsuke Ohtsuka, Osaka (JP); Yasunao Kuroda, Osaka (JP); Takahisa Arima, Osaka (JP); Hideaki Saitou, Osaka (JP)

(73) Assignee: Nippon Sheet Glass Co., Ltd., Osaka (JP)

( * ) Notice: Subject to any disclaimer, the term of this patent is extended or adjusted under 35 U.S.C. 154(b) by 0 days.

(21) Appl. No.: 09/937,041

(22) PCT Filed: Jan. 11, 2001

(86) PCT No.: PCT/JP01/00074

§ 371 (c)(1),
(2), (4) Date: Sep. 20, 2001

(87) PCT Pub. No.: WO01/57936

PCT Pub. Date: Aug. 9, 2001

(65) Prior Publication Data

US 2002/0180370 A1 Dec. 5, 2002

(30) Foreign Application Priority Data

Jan. 31, 2000 (JP) .......................... 2000-021447

(51) Int. Cl.[7] .................. G09G 3/10; H01L 33/00

(52) U.S. Cl. .................. 315/169.3; 257/88

(58) Field of Search .................. 315/169.3, 161; 362/800; 257/88, 103

(56) References Cited

U.S. PATENT DOCUMENTS 5,408,105 A  *  4/1995  Adachi et al. .............. 257/13
5,483,085 A  *  1/1996  Holm et al. .............. 257/448

FOREIGN PATENT DOCUMENTS

| EP | 0335553 | 10/1989 |
| EP | 0683528 | 11/1995 |
| JP | 60-201382 | 10/1985 |
| JP | 1-178471 | 7/1989 |
| JP | 3-83377 | 4/1991 |
| JP | 4-7165 | 1/1992 |
| JP | 4-11449 | 1/1992 |
| JP | 5-131681 | 5/1993 |
| JP | 5-212905 | 8/1993 |
| JP | 6-71938 | 3/1994 |

OTHER PUBLICATIONS

T. Kawase et al.; "Properties of 6–inch Semi–insulting GaAs Substrates Manufactured by Vertical Boat Method"; 1999; http://www.gaasmantech.org/digest/1999/PDF/66.pdf.
PCT International Search Report, Apr. 17, 2001.

* cited by examiner

Primary Examiner—Don Wong
Assistant Examiner—Thuy Vinh Tran
(74) Attorney, Agent, or Firm—RatnerPrestia

(57) ABSTRACT

The cost of a light-emitting element matrix array is reduced by implementing a function equivalent to a light-emitting thyristor by elements different therefrom. A plurality of combinational element are arrayed in one line. The plurality of combinational elements are divided into groups n by n. The bases of transistors included in each group are separately connected to base-selecting lines and the anodes of light-emitting diodes included in each group are commonly connected to one anode terminal every group.

3 Claims, 8 Drawing Sheets

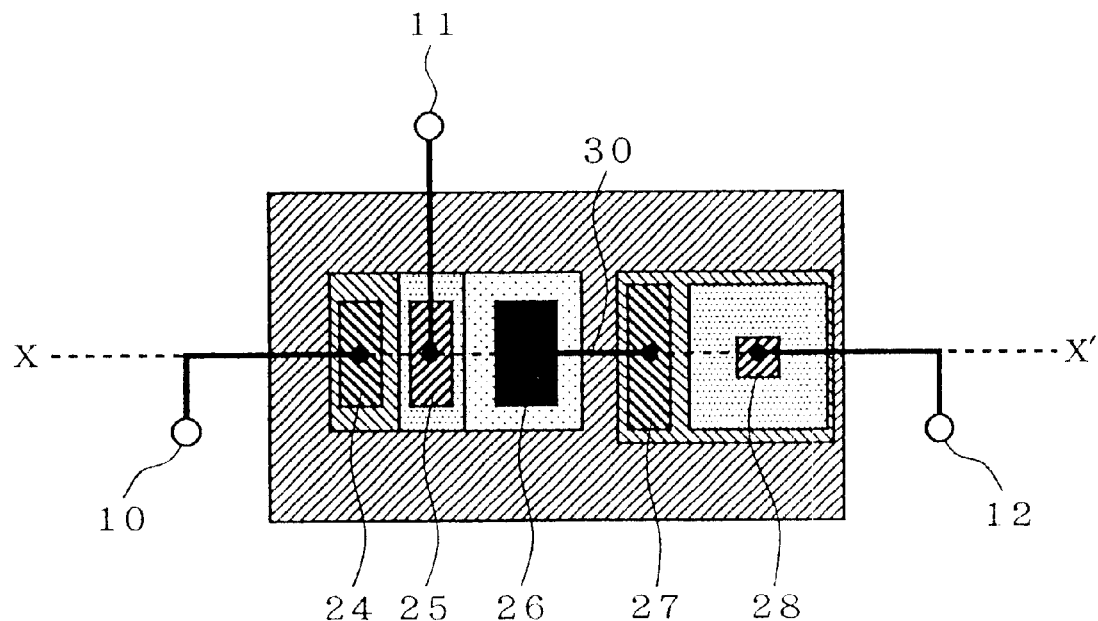
F I G. 3 A
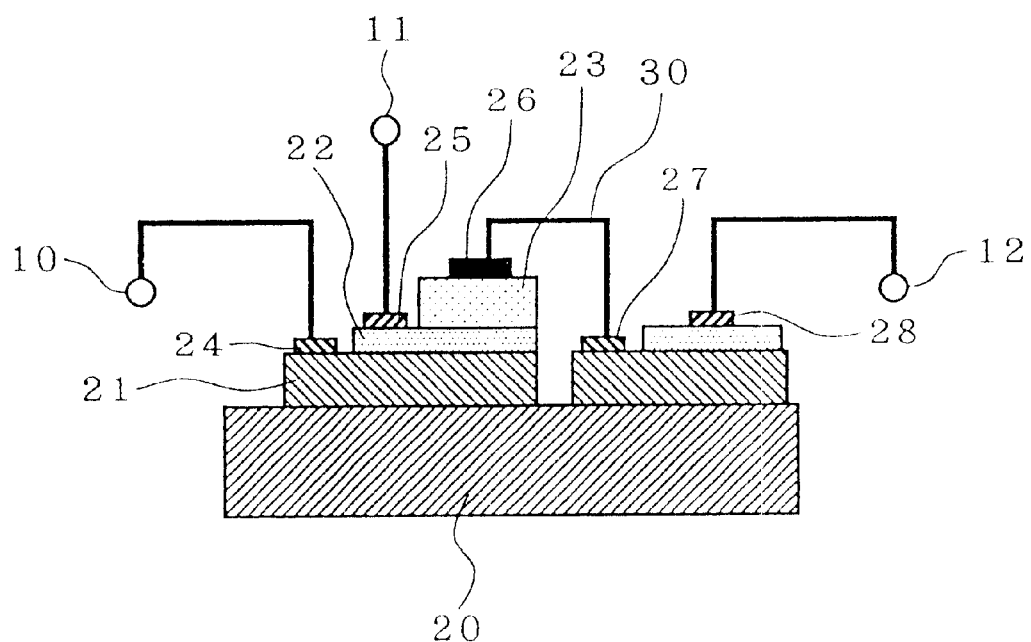
F I G. 3 B

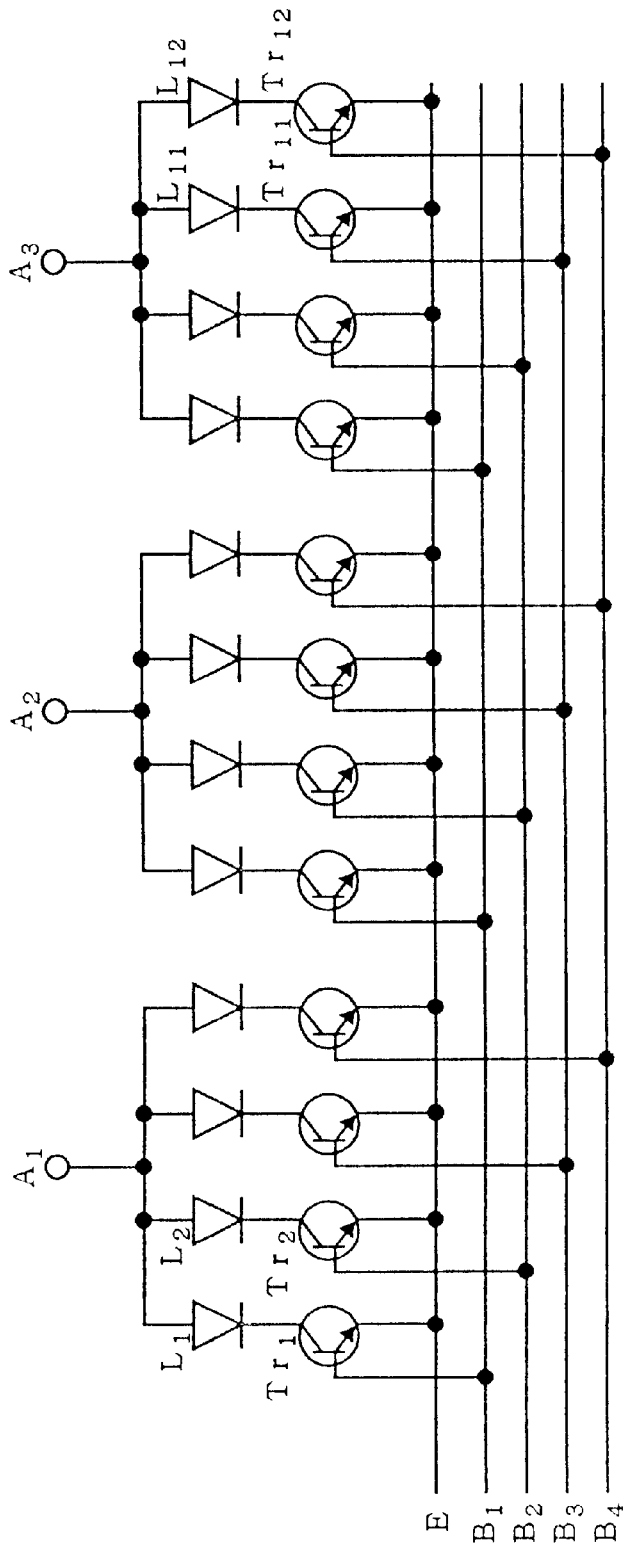
F I G . 6

LIGHT-EMITTING ELEMENT MATRIX ARRAY

TECHNICAL FIELD

This invention relates to a light-emitting element matrix array, particularly to a light-emitting element matrix array in which a light up state of light-emitting element may be controlled by a small control current.

BACKGROUND ART

In an light-emitting element array used in an optical printer, it is essentially required to derive the same number of lines from light-emitting elements as that of light-emitting elements. A wire bonding method is generally used for the derivation of lines. Therefore, the following problems are caused as the density of light-emitting elements is increased.
(1) A product cost becomes larger due to the increase of an area of a wire bonding pad on a light-emitting element array chip, i.e. an area of a chip.
(2) A production cost becomes larger due to the increase of the number of wire bondings.
(3) A production becomes difficult as a pitch of wire bonding becomes smaller.
(4) A product cost is increased because driving circuits, the number thereof is equal to that of light-emitting elements, are generally required.

An area of one bonding pad is several times or more compared with an area of one light-emitting element, so that the increase of light-emitting elements density leads to the increase of chip area.

In order to avoid these problems, a light-emitting element including a shift register, a light-emitting diode (LED) matrix array, and a light-emitting thyristor matrix array have been proposed heretofore.

The LED matrix array as shown in FIG. 1 has resolved above-described problems by providing a plurality of light-emitting diodes in one line on an insulating substrate, and constituting a matrix with an anode side and a cathode side to decrease the number of terminals derived from the array.

In FIG. 1, one or more of light-emitting diodes $L_1$, $L_2$, $L_3$, . . . may be lighted up by a combination of levels of anode electrodes $A_1$–$A_3$ and levels of cathode-selecting lines $K_1$–$K_4$. When an anode electrode $A_i$ is at a High (H) level and a cathode selecting line $K_j$ a Low (L) level, a light-emitting diode $L_{j+4(i-1)}$ is lighted up. However, a current flows from an anode driver (not shown) to a cathode driver (not shown) through a light-emitting diode, so that both of drivers require a large current driving capacity, resulting in the cost increase of driver ICs.

In order to resolve this problem, a light-emitting thyristor matrix array using a light-emitting thyristor of pnpn-structure in place of a light-emitting diode has been proposed. FIG. 2 shows the light-emitting thyristor matrix array. According to this matrix array, a plurality of light-emitting thyristors $T_1$, $T_2$, $T_3$, . . . are arrayed in one line. These thyristors are divided into groups four by four. Anodes of thyristors in each group are commonly connected to anode terminals $A_1$, $A_2$, $A_3$, . . . , respectively, gates of thyristors in each group are separately connected to gate-selecting lines $G_1$–$G_4$, and cathodes of all the thyristor are commonly connected to a cathode line K. The lighting up of thyristors $T_1$, $T_2$, $T_3$, . . . is determined by a combination of levels of gate-selecting lines $G_1$–$G_4$ and levels of anode terminals $A_1$, $A_2$, $A_3$, . . . . As this matrix array is a type of cathode common, when the cathode line K is at L level and an anode terminal $A_i$ is at H level while one gate-selecting line $G_j$ being at L level and the others H level, a light-emitting thyristor $T_{j+4(i-1)}$ is lighted up.

The gate-selecting lines only give trigger signals, so that the lighting up of the thyristors may be controlled by a small current driving capacity. As a result, the cost of a driving IC may be decreased. For this matrix array using a light-emitting thyristor, Japanese Patent has already been issued to the present applicant (Japanese Patent No. 2807910).

However, there is a problem such that the product cost thereof is high because such thyristor uses a pnpn-structure.

DISCLOSURE OF THE INVENTION

The object of the present invention is to provide a light-emitting element matrix array in which a function equivalent to a light-emitting thyristor may be implemented by elements different therefrom.

According to the present invention, a function of a light-emitting thyristor may be implemented by a combination of a transistor and light-emitting diode (LED). In this case, an LED may be fabricated by emitter and base layers or base and collector layers of a transistor, so that the combinational element of a transistor and an LED may be implemented from a three-layer structure of npn or pnp. Therefore, the thickness of an epitaxial film becomes thinner compared with a light-emitting thyristor of a four-layer pnpn-structure, resulting in a low cost of products.

Furthermore, a light-emitting element matrix array in which a light up state of light-emitting element may be controlled by a small control current may be implemented by integrating transistors and LEDs in the same wafer. Accordingly, the number of terminals derived from a light-emitting element matrix array chip may be decreased, thereby reducing an area of the chip. As a result, a high resolution light-emitting element matrix array may be easily provided.

BRIEF DESCRIPTION OF THE DRAWINGS

FIG. 3A is a plan view of a combinational element.

FIG. 3B is a cross-sectional view taken along X–X' line in FIG. 3A.

FIG. 6 shows a light-emitting element matrix array of the first embodiment.

BEST MODE FOR CARRYING OUT THE INVENTION

A preferred embodiment of a light-emitting element matrix array according to the present invention will now be described with reference to the drawings.

Embodiment 1

Figure 1:
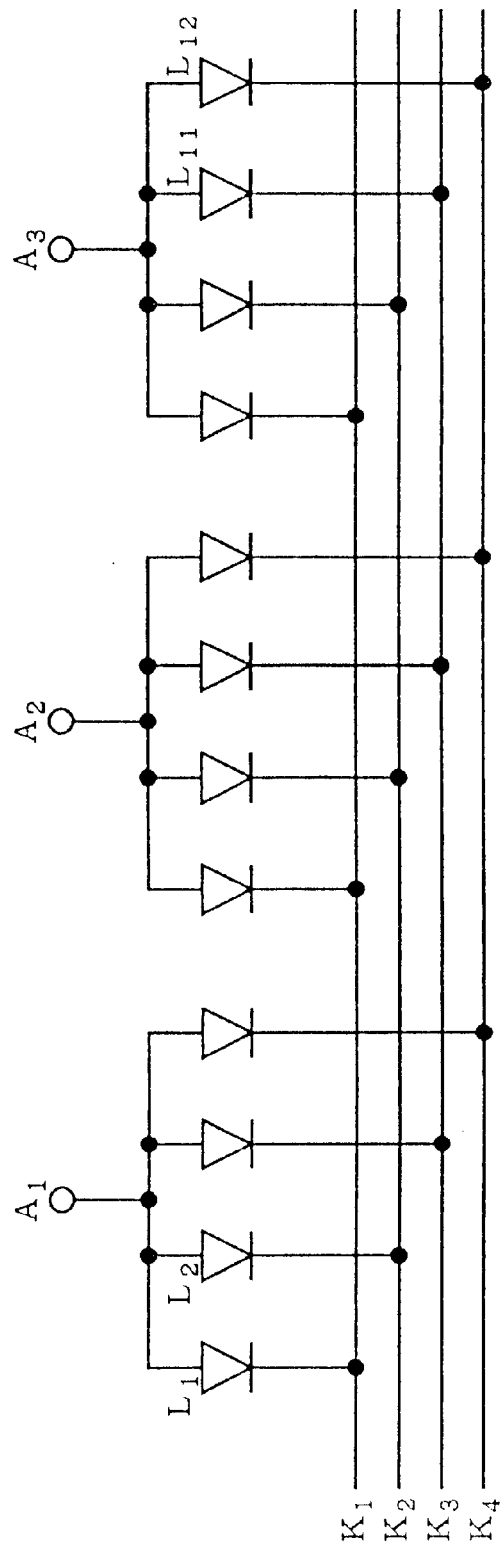
FIG. 1 shows a conventional LED matrix array.
Figure 2:
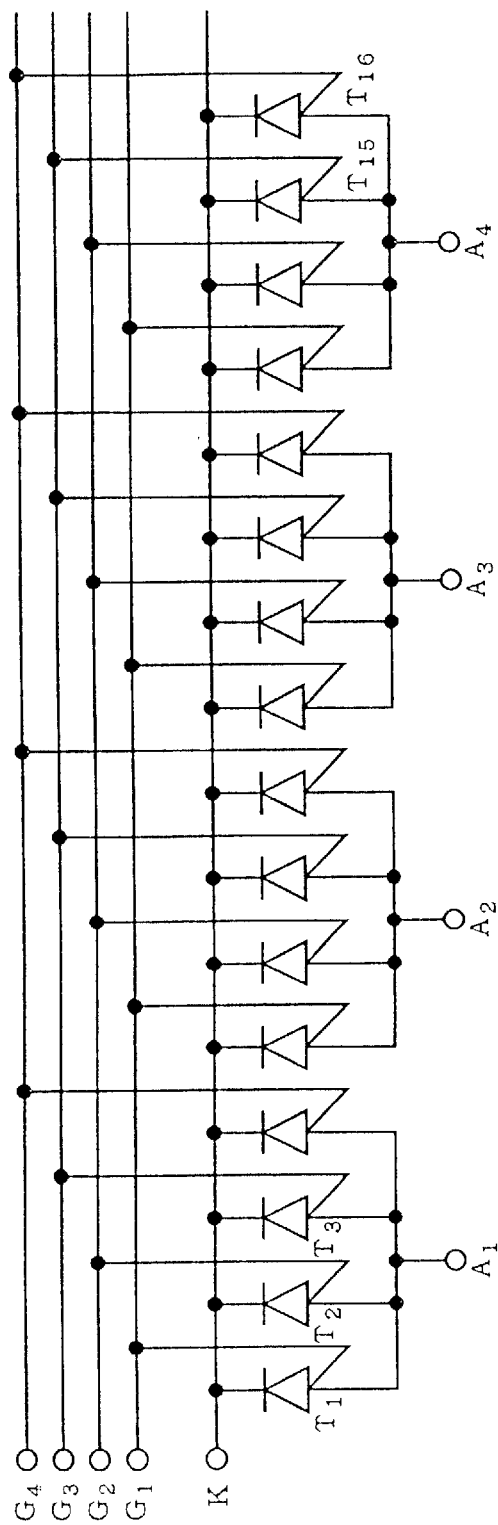
FIG. 2 shows a conventional light-emitting thyristor array.
Figure 4:
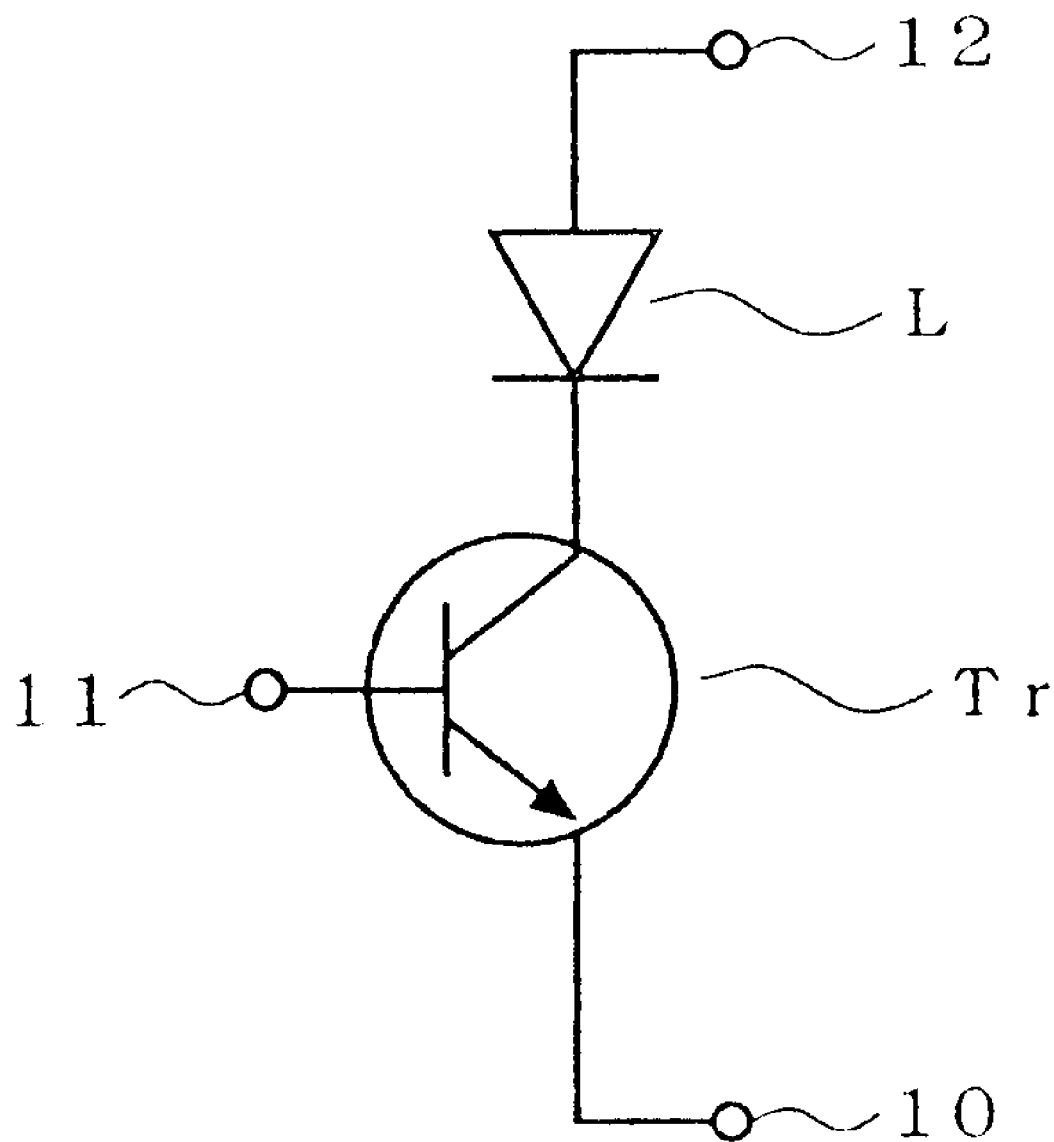
FIG. 4 is an equivalent circuit diagram of the combinational element.

Referring to FIGS. 3A and 3B, there is shown a semiconductor element consisting of a combination of a transistor and a light-emitting diode (LED), the semiconductor element constituting a light-emitting element matrix array of the present embodiment. The semiconductor element is referred to as a combinational element hereinafter. FIG. 3A is a plan view and FIG. 3B a cross-sectional view taken along X–X' line in FIG. 3A. FIG. 4 shows an equivalent circuit diagram of the combinational element. The transistor may be fabricated by depositing three layers epitaxial film of npn-structure consisting of a first n-type semiconductor layer 21, a p-type semiconductor layer 22, and a second n-type semiconductor layer 23 on a semi-insulating GaAs substrate 20, followed by mesa isolating with an etching process. Reference numeral 10 designates an emitter terminal, 11 a base terminal, 24 an ohmic electrode for an n-type layer (an emitter electrode), 25 an ohmic electrode for a p-type layer (a base electrode), 26 an ohmic electrode for an n-type layer (a collector electrode).

On the other hand, the LED is fabricated by removing the second semiconductor layer 23 from the npn-structure (21, 22, 23). Reference numeral 12 designates an anode terminal, 27 an ohmic electrode for an n-type layer (a cathode electrode), 28 an ohmic electrode for a p-type layer (an anode electrode). The cathode electrode 27 of an LED and the collector electrode 26 of a transistor is connected to each other via a line 30.

Figure 5:
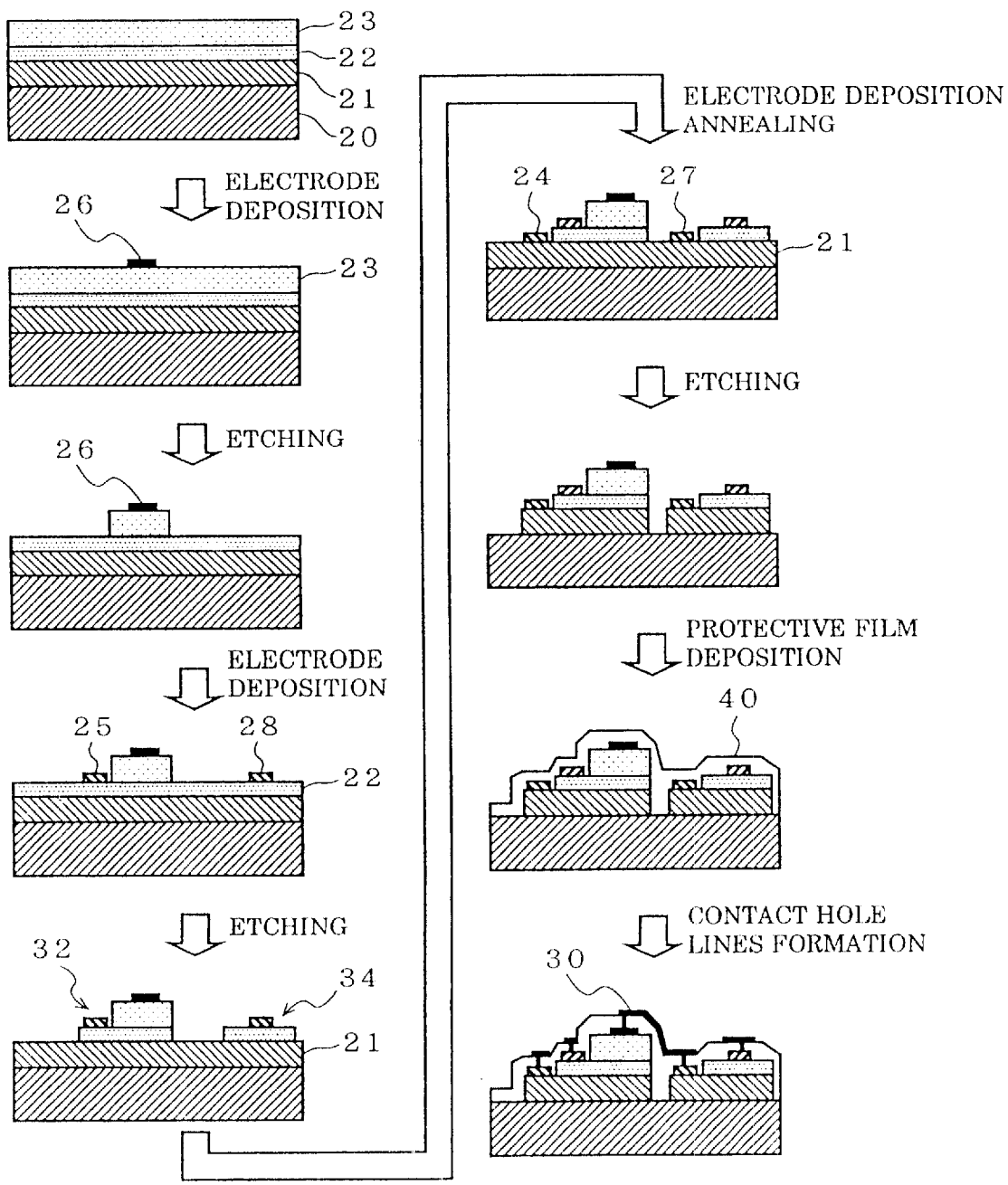
FIG. 5 shows a fabricating process for the combinational element.

Referring to FIG. 5, there is shown a fabricating process for the above-described combinational element. First, three layers epitaxial film of npn-structure consisting of the first n-type semiconductor layer 21, the p-type semiconductor layer 22, and the second n-type semiconductor layer 23 are deposited on the semi-insulating GaAs substrate 20. Then, the collector electrode 26 is formed on the n-type layer 23. Then, the n-type layer 23 is removed with a part thereof remained, the part having the collector electrode 26 thereon. Next, the base electrode 25 for a transistor and the anode electrode 28 for an LED are formed on the exposed p-type layer 22. Then, the p-type layer 22 is etched away to form a transistor island 32 and an LED island 34, respectively. Next, the emitter electrode 24 and the cathode electrode 27 are formed on the exposed n-type layer 21, followed by an annealing process. Then, the n-type layer 21 is etched away to isolate the transistor and LED in a mesa-structure. Next, a protective film 40 is deposited on the overall structure, contact holes are opened therein on each electrode 24, 25, 26, 27, 28, and lines are formed on the protective film 40.

In the present embodiment, epitaxial films as shown in Table 1 re used. Material for all the films is GaAs. AuGe/Ni/Au is used for electrodes for an n-type layer and AuZn/Au is used for electrodes for a p-type layer.

TABLE 1

| | Dopant | Impurity Concentration $10^{17}/cm^3$ | Film Thickness $\mu m$ | Note |
|---|---|---|---|---|
| Substrate | Cr | — | | Semi-insulating |
| First n-layer | Si | 20 | 0.2 | |
| P-layer | Zn | 1 | 0.1 | |
| Second n-layer | Si | 10 | 0.1 | |

In the present embodiment, while the first n-type layer is used as an emitter of the transistor and the second n-type layer as a collector of the transistor, the first n-type layer may be used as a collector of the transistor and the second n-type layer as an emitter of the transistor.

While the embodiment has explained as to an npn-structure, a pnp-structure may also be used.

According to the combinational element consisted of a transistor and LED, an LED may be lighted up by causing the emitter terminal 10 zero volts and both the base terminal 11 and the anode terminal 12 H level.

FIG. 6 shows an embodiment of a light-emitting element matrix array structured by arraying a plurality of combinational elements. In this embodiment, a plurality of combinational elements each consisting of a transistor Tr and a light-emitting diode L are divided into groups four by four. The bases of transistors in each group are separately connected to base-selecting lines $B_1$–$B_4$ of bus structure, and the emitters of all the transistors are commonly connected to an emitter line E. The anodes of LEDs in each group are connected to common anode terminals $A_1$, $A_2$, $A_3$, . . . , respectively. One or more light-emitting diodes may be selected by a combination of the levels of base selecting lines $B_1$–$B_4$ and the levels of anode terminals $A_1$, $A_2$, $A_3$, . . . . For example, the light-emitting diode $L_{j+4(i-1)}$ may be selected to light up when both the anode terminal $A_i$ and the base-selecting line $B_j$ are at H level.

Embodiment 2

Figure 7:
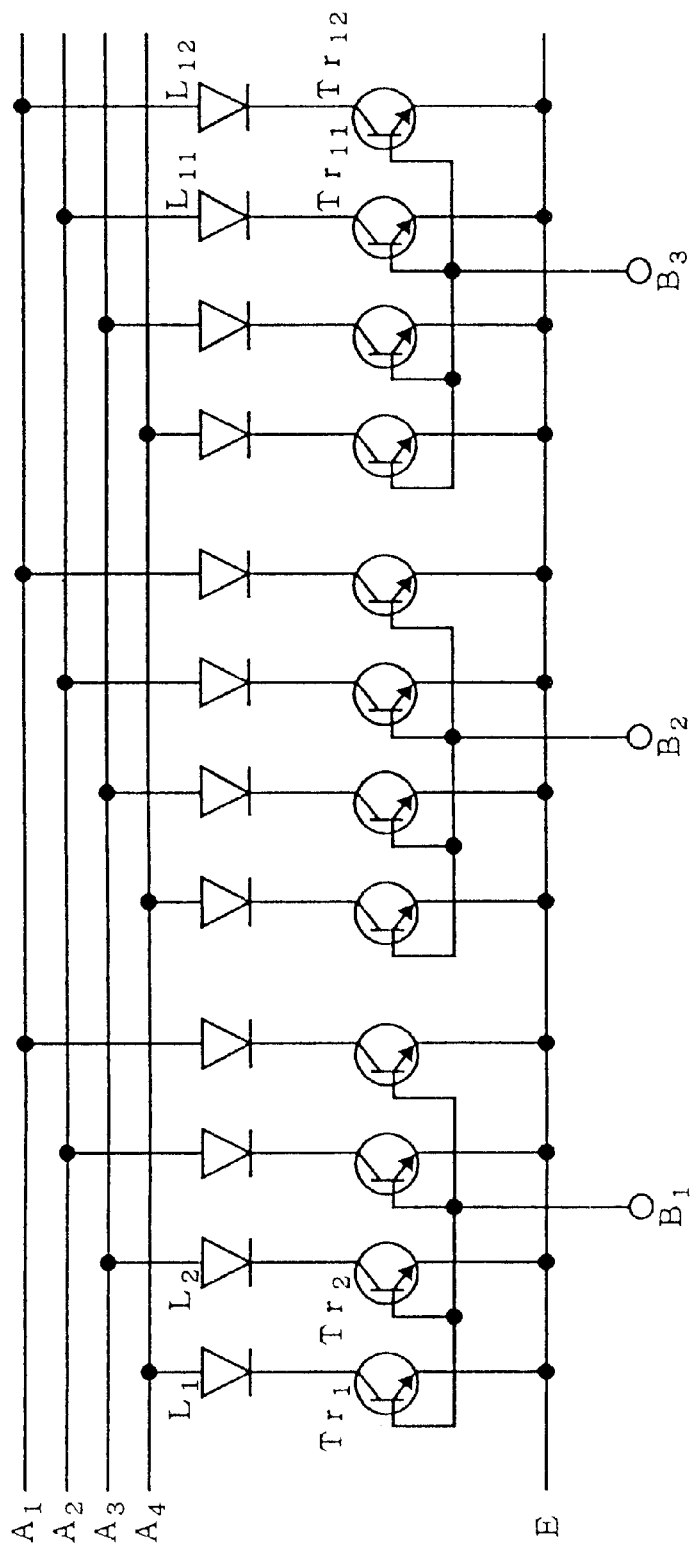
FIG. 7 shows a light-emitting element matrix array of the second embodiment.

While the base side of transistors is formed as a bus structure in the embodiment 1, the anode side of LEDs may be formed as a bus structure. FIG. 7 shows an embodiment 2 in which the anode side of LEDs is formed as a bus structure. The anodes of LEDs in each group are separately connected to anode-selecting lines $A_1$–$A_4$ of bus structure, and bases of transistors in each group are connected to common base terminals $B_1$, $B_2$, $B_3$, . . . , respectively.

According to this light-emitting element matrix array, the light-emitting diode $L_{j+4(i-1)}$ may be selected to light up when both the anode-selecting line $A_i$ and the base terminal $B_j$ are at H level.

Embodiment 3

Figure 8:
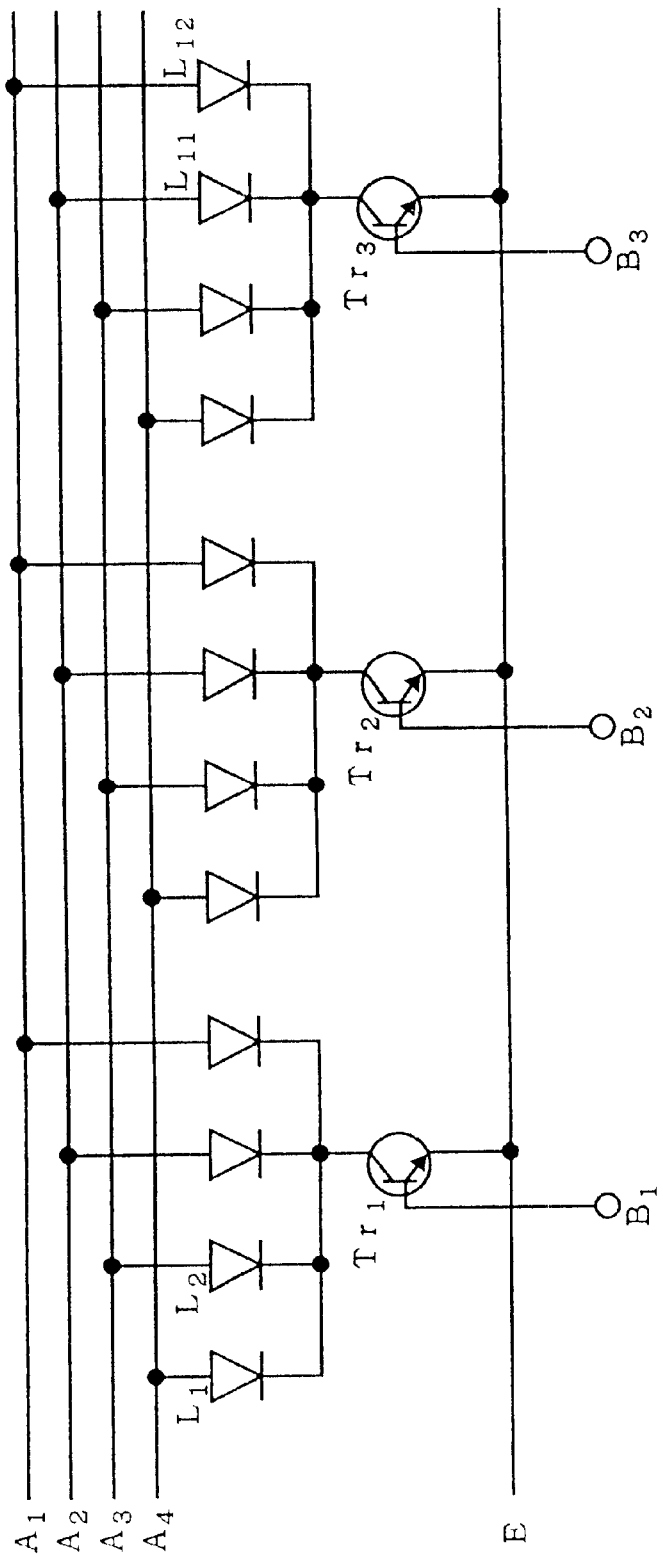
FIG. 8 shows a light-emitting element matrix array of the third embodiment.

FIG. 8 shows a variation of the embodiment 2, in which one transistor $Tr_1$, $Tr_2$, $Tr_3$, . . . may be provided with respect to a plurality of LEDs included in one group, respectively, as shown in the figure, without providing one transistor with respect to one LED. The base of each transistor is connected to a base terminal $B_1$, $B_2$, $B_3$, . . . , respectively. According to this embodiment, a product cost may be decreased because an area of elements is reduced by the area corresponding to the reduced transistors.

INDUSTRIAL APPLICABILITY

According to the present invention, the function corresponding to that of a light-emitting thyristor may be implemented by a combinational element consisting of a transistor and LED, and the combinational element may be fabricated by three-layer structure of npn or pnp, therefore it is possible to decrease the cost of the light-emitting element matrix array.

What is claimed is:

1. A light-emitting element array comprising:
   a semi-insulating substrate;
   a three layer semiconductor structure formed on the substrate including first and third layers being a first type and a second layer being a second type different from the first type;
   a plurality of combinational elements, each of said combinational elements including a transistor and a light-emitting diode both formed from the three layer structure, the plurality of combinational elements being formed on the substrate and arrayed in one line;

wherein the plurality of combinational elements are divided into groups n by n (n is an integer $\geq 2$), bases of the transistors included in each group are separately connected to n base-selecting lines of bus structure, all emitters or all collectors of the transistors are connected together, and all anodes or all cathodes of the light-emitting diodes included in each group are commonly connected to one terminal for every group.

2. A light-emitting element matrix array comprising:

a semi-insulating substrate;

a three layer semiconductor structure formed on the substrate including first and third layers having a first type and a second layer having a second type different from the first type;

a plurality of combinational elements, each of said combinational elements including a transistor and a light-emitting diode both formed from the three layer semiconductor structure, the plurality of combinational elements being formed on the substrate and arrayed in one line;

wherein the plurality of combinational elements are divided into groups n by n (n is an integer $\geq 2$), anodes or cathodes of the light-emitting diodes included in each group are separately connected to n anode-selecting lines or cathode-selecting lines of bus structure and bases of the transistors included in each group are commonly connected to one terminal for every group.

3. A light-emitting element matrix array comprising:

a semi-insulating substrate, a three layer semiconductor structure formed on the substrate including first and third layers being a first type and a second layer being a second type different from the first type;

a plurality of light-emitting diodes formed on the substrate and arrayed in one line, the plurality of light-emitting diodes being divided into groups n by n (n is an integer $\geq 2$); and a plurality of transistors formed on the substrate, each transistor being commonly connected to the diodes included in each group, wherein the transistors and light-emitting diodes are both formed from the three layer semiconductor structure; and wherein anodes or cathodes of light-emitting elements included in each group are separately connected to n anode-selecting lines or cathode-selecting lines of bus structure, a base of each transistor is connected to one terminal, respectively.

* * * * *